(12) United States Patent
Albagli et al.

(10) Patent No.: US 7,897,929 B2
(45) Date of Patent: Mar. 1, 2011

(54) REDUCED COST PIXEL DESIGN FOR FLAT PANEL X-RAY IMAGER

(75) Inventors: Douglas Albagli, Clifton Park, NY (US); Aaron Judy Couture, Schenectady, NY (US); William Andrew Hennessy, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 292 days.

(21) Appl. No.: 11/999,909

(22) Filed: Dec. 6, 2007

(65) Prior Publication Data
US 2009/0146069 A1    Jun. 11, 2009

(51) Int. Cl.
*H01L 27/146* (2006.01)
*H01L 27/088* (2006.01)

(52) U.S. Cl. .................. 250/370.09; 257/401
(58) Field of Classification Search ........... 250/370.09, 250/370.11, 370.14; 257/292, E31.092
See application file for complete search history.

(56) References Cited

U.S. PATENT DOCUMENTS

| | | | |
|---|---|---|---|
| 4,597,001 A | 6/1986 | Bortscheller et al. | 357/23.7 |
| 5,057,889 A | 10/1991 | Yamada et al. | 357/23.7 |
| 5,610,404 A * | 3/1997 | Possin | 250/370.09 |
| 6,724,010 B1 * | 4/2004 | Kwasnick et al. | 257/59 |
| 2006/0131669 A1 | 6/2006 | Albagli et al. | 257/401 |
| 2007/0122948 A1 * | 5/2007 | Wei et al. | 438/151 |

FOREIGN PATENT DOCUMENTS

EP    333151 A2    9/1989

* cited by examiner

*Primary Examiner*—David P Porta
*Assistant Examiner*—Faye Boosalis
(74) *Attorney, Agent, or Firm*—John K. Klindtworth

(57) ABSTRACT

A pixel structure for a flat panel detector is constructed in which the diode silicon and the FET silicon are simultaneously etched to form isolated structures (array photodiodes, I/O elements, and so on) in which the edges or perimeters of the diode silicon features are self-aligned to the underlying FET SI features. The full, as-deposited, thickness of the FET gate dielectric and (at least) part of the FET silicon layer remains underneath the diode silicon across the entirety of the flat panel detector.

20 Claims, 4 Drawing Sheets

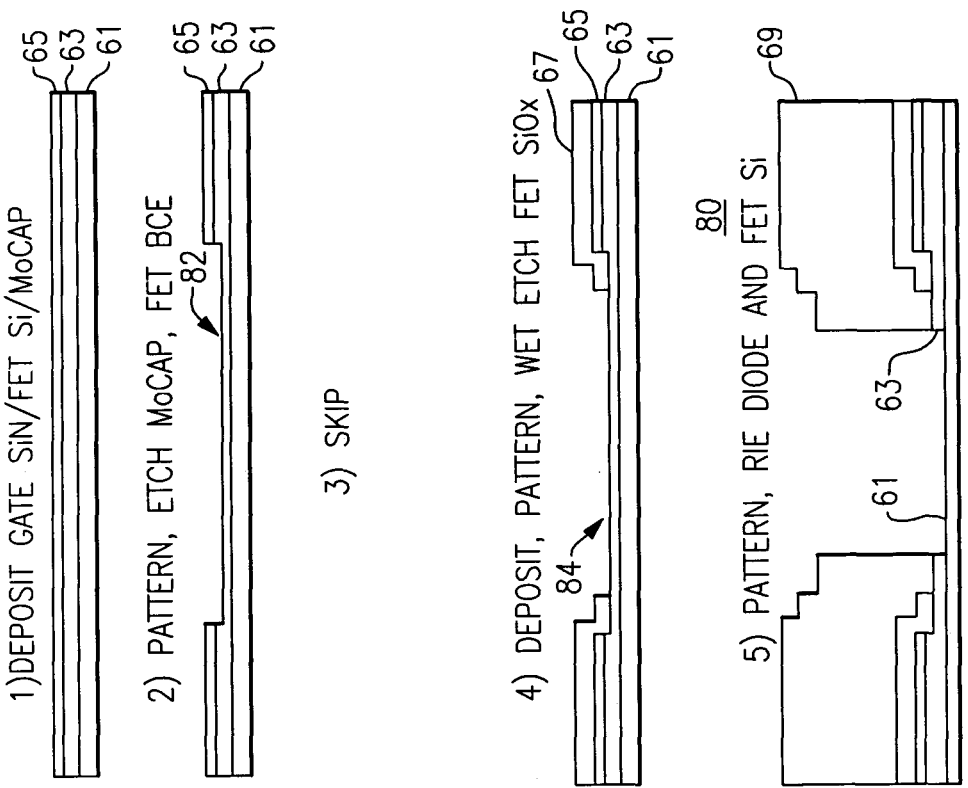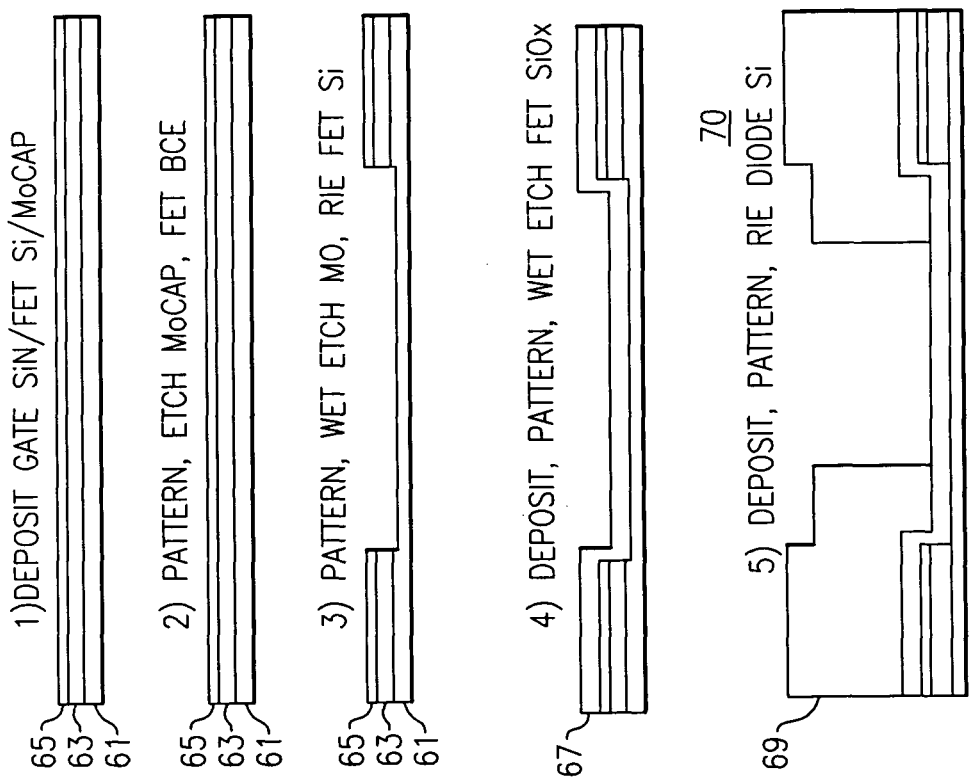

REDUCED COST PIXEL DESIGN FOR FLAT PANEL X-RAY IMAGER

BACKGROUND

The invention relates generally to imaging systems. In particular, the invention relates to an imaging panel for use in a digital x-ray detector.

Non-invasive imaging broadly encompasses techniques for generating images of the internal structures or regions of a person or object that are otherwise inaccessible for visual inspection. For example, non-invasive imaging techniques are commonly used in the industrial field for inspecting the internal structures of parts and in the security field for inspecting the contents of packages, clothing, and so forth. One of the best known uses of non-invasive imaging, however, is in the medical arts where these techniques are used to generate images of organs and/or bones inside a patient which would otherwise not be visible.

One class of non-invasive imaging techniques that may be used in these various fields is based on the differential transmission of X-rays through a patient or object. In the medical context, a simple X-ray imaging technique may involve generating X-rays using an X-ray tube or other source and directing the X-rays through an imaging volume in which the part of the patient to be imaged is located. As the X-rays pass through the patient, the X-rays are attenuated based on the composition of the tissue they pass through. The attenuated X-rays then impact a detector that converts the X-rays into signals that can be processed to generate an image of the part of the patient through which the X-rays passed based on the attenuation of the X-rays. Typically the X-ray detection process utilizes a scintillator, which generates optical photons when impacted by X-rays, and an array of photosensor elements, which generate electrical signals based on the number of optical photons detected.

A significant fraction of the cost of a digital x-ray detector is the imaging panel that contains the two dimensional pixel array composed of light sensitive photo-diodes and field effect transistors (FET)s. This panel is composed of a series of patterned thin film layers deposited on a thin glass substrate using standard semi-conductor processing techniques. Each additional layer adds to the total manufacturing time (cycle time) and the final yield of the detector; and both cycle time and yield add to the total cost of the detector.

One known technique for reducing the cycle time includes processing larger glass substrates, each containing multiple x-ray detectors, which effectively reduces the cycle time. Another known technique for reducing the cycle time includes investing in larger manufacturer capacity. Manufacturers of digital x-ray imaging systems are constantly working on incremental yield improvements via root cause analysis of failure mechanisms and fine-tuning the manufacturing process. Panel and pixel designs are generally chosen based on a trade-off of cost and performance.

A need therefore exists for an imaging panel for use in a digital x-ray detector that reduces both the cost and cycle time associated with the production of a digital x-ray imaging system.

BRIEF DESCRIPTION

According to one embodiment, an X-ray imager comprises:
a flat panel detector configured to generate electrical signals in response to incident X-rays, the flat panel detector comprising:
an array of pixels, each pixel comprising a silicon FET and a silicon diode, each FET comprising a gate dielectric layer and a silicon layer, wherein the full, as-deposited, thickness of the FET gate dielectric and at least part of the FET silicon layer remains beneath the diode silicon across the entirety of the flat panel detector in which the edges or perimeters of the diode silicon features are self-aligned to the underlying FET silicon features.

According to another embodiment, a pixel structure for an X-ray imager comprises:
a silicon diode; and
a silicon FET comprising:
a gate dielectric layer; and
a silicon layer deposited on top of the gate dielectric layer,
wherein the full, as-deposited, thickness of the gate dielectric layer and at least part of the silicon layer remains beneath the diode silicon across the entirety of the pixel structure in which the edges or perimeters of the diode silicon features are self-aligned to the underlying FET silicon features.

According to yet another embodiment, a method of manufacturing a detector for use in an imaging system comprises:
forming an array of pixels, each pixel comprising a silicon FET and a silicon diode, each FET comprising a gate dielectric layer and a silicon layer, wherein the full, as-deposited, thickness of the FET gate dielectric and at least part of the FET silicon layer remains beneath the diode silicon across the entirety of the detector in which the edges or perimeters of the diode silicon features are self-aligned to the underlying FET silicon features.

According to still another embodiment, a method of manufacturing a pixel element for use in an imaging system, the method comprising:
forming a silicon FET and a silicon diode, each FET comprising a gate dielectric layer and a silicon layer, wherein the full, as-deposited, thickness of the FET gate dielectric and at least part of the FET silicon layer remains beneath the diode silicon across the entirety of the pixel element in which the edges or perimeters of the diode silicon features are self-aligned to the underlying FET silicon features.

According to still another embodiment, a method of manufacturing a pixel element for use in an imaging detector panel comprises:
depositing a gate dielectric layer;
depositing a silicon layer on top of the gate dielectric layer;
depositing a molybdenum layer on top of the silicon layer;
depositing a silicon oxide layer on top of the molybdenum layer;
depositing a diode silicon layer on top of the silicon oxide layer, wherein all layers are deposited uniformly over the imaging detector panel; and
selectively patterning and etching each layer subsequent to its deposition to determine where the deposited layer material remains, such that the full, as-deposited, thickness of the gate dielectric layer and at least part of the silicon layer remains beneath the diode silicon across the entirety of the pixel element in which the edges or perimeters of the diode silicon features are self-aligned to the underlying silicon features.

According to still another embodiment, a method of manufacturing a pixel element for use in an imaging detector panel comprises:
depositing a gate dielectric layer;
depositing a silicon layer on top of the gate dielectric layer;
depositing a molybdenum layer on top of the silicon layer;
depositing a silicon oxide layer on top of the molybdenum layer;

depositing a diode silicon layer on top of the silicon oxide layer, wherein all layers are deposited uniformly over the imaging detector panel; and simultaneously etching the diode silicon layer and the silicon layer such that the full, as-deposited, thickness of the gate dielectric layer and at least part of the silicon layer remains beneath the diode silicon across the entirety of the pixel element in which the edges or perimeters of the diode silicon features are self-aligned to the underlying silicon features.

According to still another embodiment, a method of manufacturing a detector panel for use in an imaging system comprises:

depositing a gate dielectric layer;
depositing a silicon layer on top of the gate dielectric layer;
depositing a molybdenum layer on top of the silicon layer;
depositing a silicon oxide layer on top of the molybdenum layer;
depositing a diode silicon layer on top of the silicon oxide layer, wherein all layers are deposited uniformly over the detector panel; and
simultaneously etching the diode silicon layer and the silicon layer to form isolated pixel structures such that the full, as-deposited, thickness of the gate dielectric layer and at least part of the silicon layer remains beneath the diode silicon across the entirety of the detector panel in which the edges or perimeters of the diode silicon features are self-aligned to the underlying silicon features, wherein all layers are deposited uniformly over the detector panel.

DRAWINGS

These and other features, aspects, and advantages of the present invention will become better understood when the following detailed description is read with reference to the accompanying drawings in which like characters represent like parts throughout the drawings, wherein:

FIG. 4 is a cross-sectional view of a flat panel x-ray detector constructed using a conventional mask process; and FIG. 5 is a cross-sectional view of the flat panel x-ray detector shown in FIG. 3 constructed using a mask process according to one aspect of the present invention.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
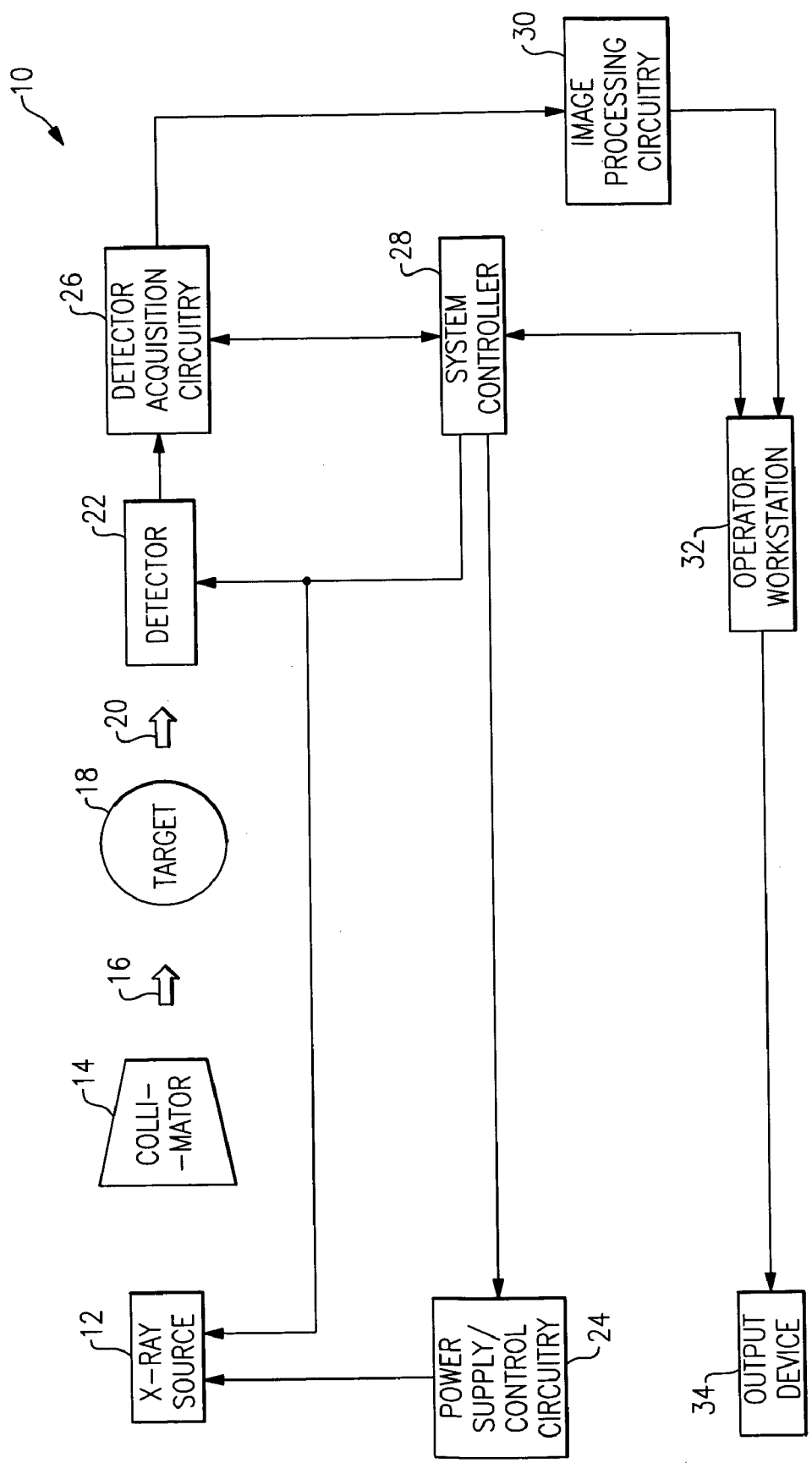
FIG. 1 is a diagrammatic representation of an exemplary X-ray imaging system.

FIG. 1 illustrates an X-ray imaging system designated generally by a reference numeral 10. According to one embodiment, the X-ray imaging system 10 is designed to acquire and process image data as described in greater detail below. The X-ray imaging system 10 includes an X-ray source 12 positioned adjacent to a collimator 14. In one embodiment, the X-ray source 12 is a low-energy source and is employed in low energy imaging techniques, such as fluoroscopic techniques, or the like. Collimator 14 permits a stream of X-ray radiation 16 to pass into a region in which a target 18, such as a human patient, is positioned. A portion of the radiation is attenuated by the target 18. This attenuated radiation 20 impacts a detector 22, such as a fluoroscopic detector. As will be appreciated by one of ordinary skill in the art, the detector 22 may be based on scintillation, i.e., optical conversion, direct conversion, or on other techniques used in the generation of electrical signals based on incident radiation. For example, a scintillator-based detector converts X-ray photons incident on its surface to optical photons. These optical photons may then be converted to electrical signals by employing photodiodes. Conversely, a direct conversion detector directly generates electrical charges in response to X-ray's; and the electrical signals are stored and read out from storage capacitors. As described in detail below, these electrical signals, regardless of the conversion technique employed are acquired and processed to construct an image of the features within the target 18.

The X-ray source 12 is controlled by power supply/control circuitry 24 which furnishes both power and control signals for examination sequences. Moreover, detector 22 is coupled to detector acquisition circuitry 26, which commands acquisition of the signals generated in the detector 22. Detector acquisition circuitry 26 may also execute various signal processing and filtration functions, such as, for initial adjustment of dynamic ranges, interleaving of digital, and so forth.

In the depicted exemplary embodiment, one or both of the power supply/control circuitry 24 and detector acquisition circuitry 26 are responsive to signals from a system controller 28. In some exemplary systems it may be desirable to move one or both of the detector 22 or the X-ray source 12. In such systems, a motor subsystem may also be present as a component of the system controller 28 to accomplish this motion. In the present example, the system controller 28 also includes signal processing circuitry, typically based upon a general purpose or application specific digital computer. The system controller 28 may also include memory circuitry for storing programs and routines executed by the computer, as well as configuration parameters and image data, interface circuits, and so forth.

Image processing circuitry 30 is also present in the depicted embodiment of the X-ray imaging system 10. The image processing circuitry 30 receives acquired projection data from the detector acquisition circuitry 26 and processes the acquired data to generate one or more images based on X-ray attenuation.

One or more operator workstations 32 are also present in the depicted embodiment of the X-ray imaging system 10. The operator workstation 32 allows an operator to initiate and configure an X-ray imaging examination and to view the images generated as part of the examination. For example, the system controller 28 is generally linked to operator workstation 32 so that an operator, via one or more input devices associated with the operator workstation 32, may provide instructions or commands to the system controller 28.

Similarly, the image processing circuitry 30 is linked to the operator workstation 32 such that the operator workstation 32 may receive and display the output of the image processing circuitry 30 on an output device 34, such as a display or printer. The output device 34 may include standard or special purpose computer monitors and associated processing circuitry. In general, displays, printers, operator workstations, and similar devices supplied within the system may be local to the data acquisition components or may be remote from these components, such as elsewhere within an institution or hospital or in an entirely different location. Output devices and operator workstations that are remote from the data acquisition components may be linked to the image acquisition system via one or more configurable networks, such as the internet, virtual private networks, and so forth. As will be appreciated by one of ordinary skill in the art, though the system controller 28, image processing circuitry 30, and operator workstation 32 are shown distinct from one another in FIG. 1, these components may actually be embodied in a single processor-based system, such as a general purpose or application specific digital computer. Alternatively, some or all of these components may be present in distinct processor-based systems, such as a general purpose or application specific digital computers, configured to communicate with one another. For example, the image processing circuitry 30 may be a component of a distinct reconstruction and viewing workstation.

Flat panel x-ray detectors are typically composed of a light sensitive imaging panel, associated electronics to operate this panel, a scintillator screen, and a protective cover. The light sensitive panel is composed of a series of thin films of metal, dielectric, and semi-conductor material deposited on a thin glass substrate. For each layer, the desired material is deposited, lithographically patterned, and then etched to form the intended two-dimensional design. In order to fabricate a field effect transistor (FET) at each pixel, several layers are needed including a gate metal layer, a FET silicon layer, a source/drain layer, and a FET passivation layer. In order to fabricate an additional photodiode at each pixel, a diode silicon layer, a diode passivation layer, and a common electrode metal layer are typically required. Additional layers may also be needed in order to optimize the performance and/or manufacturability of the process.

Figure 2:
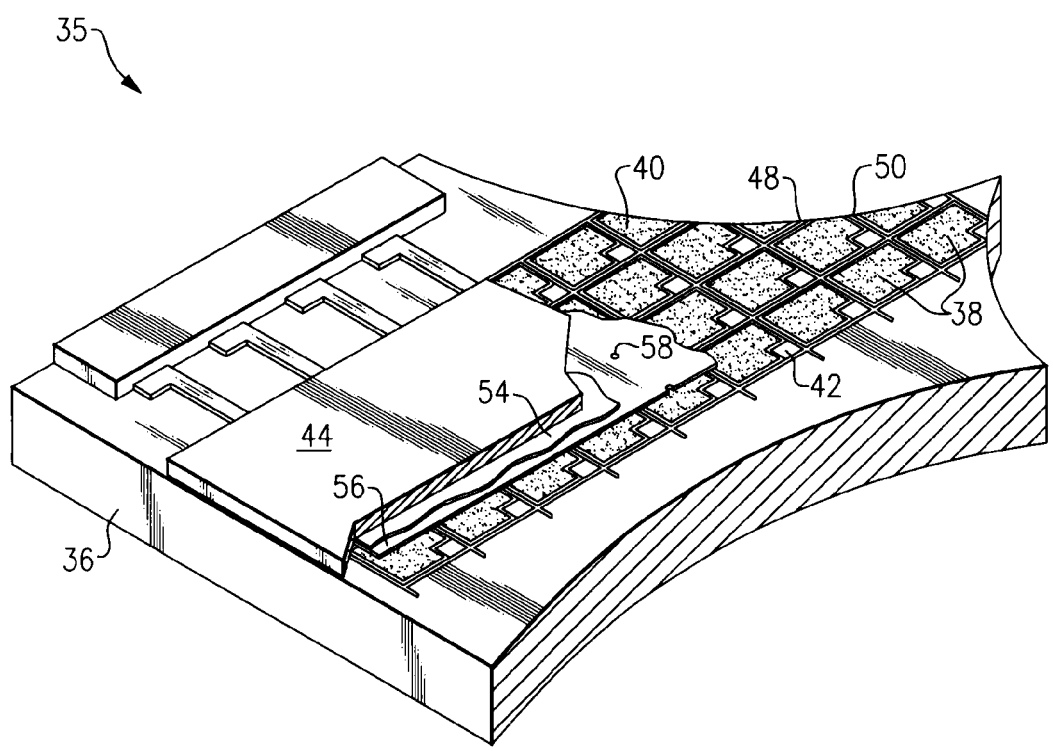
FIG. 2 is a cut-away perspective view of a detector.

Referring now to FIG. 2, a scintillation-based detector 35 suitable for use as the detector 22 depicted in FIG. 1 is described herein below. Though the scintillation-based detector 35 of FIG. 2 is discussed herein as an example for use with the present technique, it should be remembered that this is only one example. Discussion of the scintillation-based detector 35, therefore, should be understood to be merely exemplary and presented for the purpose of illustrating the principles of operation for one type of detector which may benefit from the present technique.

Turning again to FIG. 2, an exemplary physical arrangement of the components of a scintillation-based detector 35 is presented in accordance with one embodiment. The detector 35 includes a glass substrate 36 on which the components described below are disposed.

In the depicted embodiment, the scintillation-based detector 35 includes an array of photosensor elements 38. In one implementation, the photosensor elements 38 are photodiodes formed from silicon. In the exemplary embodiment of FIG. 2, the photodiodes are arranged in an array of rows and columns that define the pixels, or picture elements, read out by the detector acquisition circuitry 26 shown in FIG. 1. Each photodiode includes a photosensitive region 40, and a thin film transistor (TFT) 42 such as an FET, which may be selectively activated using data lines 48 and scan lines 50.

Further, the scintillation-based detector 35 includes a scintillator 44, which, when exposed to X-rays, generates the optical photons detected by the photosensitive regions 40. As illustrated in this embodiment, a conductive layer 54 disposed on a dielectric layer 56 is disposed between the scintillator 44 and the array of photosensor elements 38. Vias 58 electrically couple the conductive layer 54 to the top surface of each element of the array of photosensor elements 38 to allow a common bias to be applied to each photosensor element.

Figure 3:
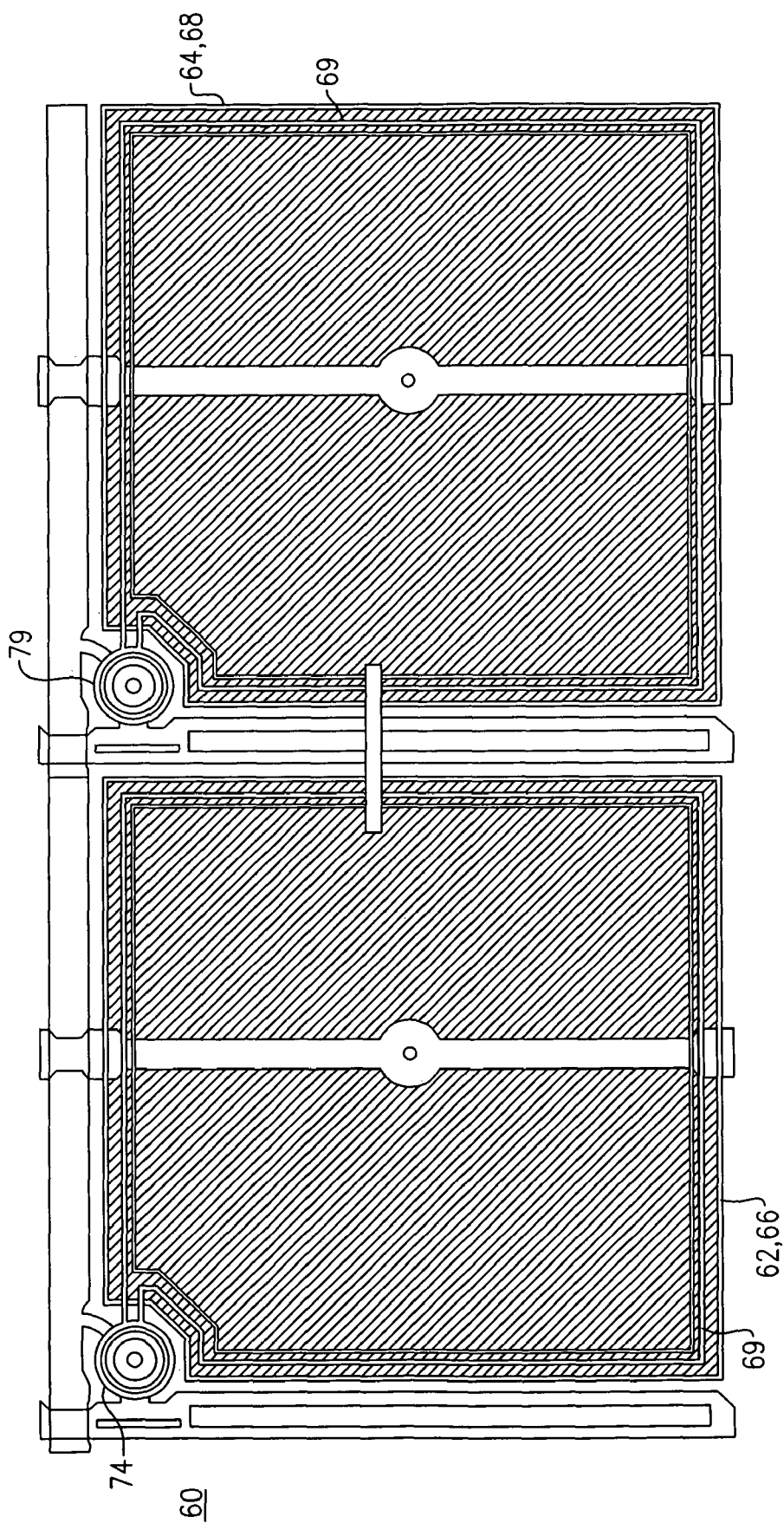
FIG. 3 is a plan view illustrating a portion of a flat panel x-ray detector, in accordance with one aspect of the present invention.

Referring now to FIG. 3, a plan view illustrates two-pixels within a portion of a flat panel x-ray detector structure 60, in accordance with one aspect of the present invention. Flat panel x-ray detector structure 60 comprises a two-dimensional pixel array including light sensitive photo-diode islands 62, 64 and field effect transistor islands 66, 68 and is constructed using a series of patterned thin film layers deposited on a thin glass substrate (i.e. 36 in FIG. 2). The edges of photo-diode island 62 are coincident with the edges of FET island 66, while the edges of photo-diode island 64 are coincident with the edges of FET island 68. A FET SiOx hard mask layer 69 functions to protect the FET silicon in the respective circular FET areas 74, 79.

The desired material for each layer is deposited, lithographically patterned, and then etched to form the intended two-dimensional structure. Several layers are required to fabricate a FET at each pixel. These include, but are not limited to, a gate metal layer, a FET silicon layer, a source/drain metal layer, and a FET passivation layer. A diode passivation layer and a common electrode metal layer are typically required to also fabricate a photodiode at each pixel. Additional layers may also be needed to optimize performance and/or manufacturability of the process.

FIG. 4 is a cross-sectional view showing one portion of a pixel structure 70 for a flat panel x-ray detector structure in which the pixel structure 70 is fabricated with a conventional mask process. The conventional mask process commences by first depositing, and then patterning and etching a gate metal (not shown). Subsequent to the above initial gate metal deposition, patterning, and etching level, pixel structure 70 is constructed by first depositing a tri-layer comprising a gate dielectric (SiN) layer 61 deposited on top of the gate metal layer, a FET silicon layer 63 deposited on top of the SiN layer 61, and a molybdenum (Mo) layer 65 deposited on top of the FET silicon layer 63 as shown in level 1).

Subsequent to the foregoing level 1 deposition process, patterning and etching of the Mo layer 65 and patterning and back channel etching (BCE) FET silicon layer 63 are performed in level 2).

Next, patterning and wet etching of the Mo layer 65, and patterning and dry etching via a reactive ion etch (RIE) process of the FET silicon layer 63 are then performed as shown in level 3).

Following level 3) processing, a FET silicon oxide layer 67 is deposited, patterned, and wet etched as shown in level 4).

Finally, the diode silicon 69 is deposited, patterned and dry etched via RIE as shown in level 5) to form and complete pixel structure 70.

Keeping the pixel structure 70 fabricated with a conventional mask process as described above in mind, FIG. 5 is a cross-sectional view of the flat panel x-ray detector structure 60 shown in FIG. 3 constructed using a mask process according to one aspect of the present invention. Unlike the pixel structure 70 shown in FIG. 4 that is produced when using a conventional mask process, the pixel structure 80 shown in FIG. 5 is produced by patterning and etching both the FET silicon and diode silicon at the same time. Because the diode silicon and FET silicon are deposited in subsequent steps, simultaneous etching of both layers requires that the FET silicon layer be underneath the photodiode silicon everywhere on the detector structure 60. This mask process requires removal of any corresponding FET passivation layer from areas where the FET and diode silicon are simultaneously removed, to allow etching to penetrate to the FET silicon layer between all pixels. In this way, the mask process eliminates the FET silicon photolithograph steps, the FET silicon dry etch step, and the associated cleaning steps.

Removing one silicon etch step advantageously improves the overall yield by eliminating small areas of un-etched silicon that cause cluster type defects.

With continued reference now to FIG. 5, a mask process according to one aspect of the present invention commences by first depositing, and then patterning and etching a gate metal (not shown). Subsequent to the above initial gate metal deposition, patterning, and etching level, pixel structure 70 is constructed by first depositing a tri-layer comprising a gate dielectric (SiN) layer 61 deposited on top of the gate metal layer, a FET silicon layer 63 deposited on top of the SiN layer 61, and a molybdenum (Mo) layer 65 deposited on top of the FET silicon layer 63 as shown in level 1).

Subsequent to the foregoing tri-layer deposition process, patterning and etching of the Mo layer 65 and patterning and back channel etching (BCE) FET silicon layer 63 are performed as shown in level 2). Etching in level 2) for this embodiment is implemented completely through Mo layer 65 and partially into the FET silicon layer 63 to expose a first portion 82 of the FET silicon layer 63.

Patterning and wet etching of the Mo layer 65, and patterning and dry etching via a reactive ion etch (RIE) process of the FET silicon layer 63 that is required during conventional level 3) mask processing such as described above with reference to FIG. 4, is not required for this mask process since the FET silicon layer 63 must remain beneath the diode silicon everywhere on the detector structure 60.

Following level 2) processing, a FET silicon oxide layer 67 is deposited, patterned, and wet etched as shown in what is depicted as level 4). Deposition, patterning and wet etching of the FET silicon oxide layer 67 in level 4) is implemented to expose a second portion 84 of the FET silicon layer 63.

Finally, at what is now level 5), the photodiode (diode) silicon 69 is deposited over the entire pixel structure 80; and both the FET silicon layer 63 and the diode silicon 69 are patterned and RIE etched at the same time to provide the desired pixel structure 80 that includes exposed gate dielectric (SiN) layer 61 and exposed FET silicon layer 63 as shown in what is depicted as level 5).

The mask process described above with reference to FIG. 5 also requires removal of any corresponding FET passivation layer from areas where the FET and diode silicon are removed, to allow etching to penetrate to the FET silicon layer 63 between all pixels. This mask process advantageously eliminates the FET silicon photolithograph steps, the FET silicon dry etch step, and the associated cleaning steps, as stated herein before. Removing one silicon etch step improves the overall yield by eliminating small areas of un-etched silicon that can cause cluster type defects, as also stated herein before.

The full, as-deposited, thickness of the FET gate dielectric 61 and (at least) part of the FET silicon layer 63 remains underneath the diode silicon 69 across the entirety of the flat panel detector 60 due to the resultant pixel structure 80 that is provided using the foregoing process in which the diode silicon 69 and the FET silicon 63 are simultaneously etched to form isolated structures (array photodiodes, I/O elements, and so on) in which the edges or perimeters of the diode silicon 69 features are self-aligned to the underlying FET Si 63 features.

The above process advantageously reduces the cycle time and increases the yield associated with the manufacture of flat panel x-ray detectors in a manner that does not require addition to or modification of existing production equipment and/or manufacturing facilities.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An X-ray imager comprising:
   a flat panel detector configured to generate electrical signals in response to incident X-rays, the flat panel detector comprising:
      an array of pixels, each pixel comprising a silicon FET and a silicon diode, each FET comprising a gate dielectric layer and a silicon layer, wherein the full, as-deposited, thickness of the FET gate dielectric and at least part of the FET silicon layer remains beneath the diode silicon across the entirety of the flat panel detector in which the edges or perimeters of the diode silicon features are self-aligned to the underlying FET silicon features.

2. The X-ray imager of claim 1, wherein each silicon diode is a light sensitive photo-diode configured to generate electrical signals in response to optical photons emitted from a scintillator.

3. The X-ray imaging system of claim 1, wherein each silicon FET is a thin film transistor configured as a switch responsive to the electrical signals generated by the photo-diode.

4. The X-ray imaging system of claim 1, wherein each silicon FET and its corresponding diode together comprise:
   a gate dielectric layer;
   a silicon layer deposited on top of the gate dielectric layer;
   a molybdenum layer deposited on top of a first portion of the silicon layer;
   a silicon oxide layer deposited on top of the molybdenum layer and on top of a second portion of the silicon layer; and
   a diode silicon layer deposited on top of the silicon oxide layer and on top of a third portion of the silicon layer.

5. A pixel structure for an X-ray imager, the pixel structure comprising:
   a silicon diode; and
   a silicon FET comprising:
      a gate dielectric layer; and
      a silicon layer deposited on top of the gate dielectric layer, wherein the full, as-deposited, thickness of the gate dielectric layer and at least part of the silicon layer remains beneath the diode silicon across the entirety of the pixel structure in which the edges or perimeters of the diode silicon features are self-aligned to the underlying FET silicon features.

6. The pixel structure of claim 5, wherein each silicon diode is a light sensitive photodiode configured to generate electrical signals in response to optical photons.

7. The pixel structure of claim 5, wherein each silicon FET is a thin film transistor configured as a switch responsive to the electrical signals generated by the photodiode.

8. The pixel structure of claim 5, wherein the silicon FET and the silicon diode together comprise:
   a gate dielectric layer;
   a silicon layer deposited on top of the gate dielectric layer;
   a molybdenum layer deposited on top of a first portion of the silicon layer;
   a silicon oxide layer deposited on top of the molybdenum layer and on top of a second portion of the silicon layer; and
   a diode silicon layer deposited on top of the silicon oxide layer and on top of a third portion of the silicon layer.

9. A method of manufacturing a detector for use in an imaging system, the method comprising:

forming an array of pixels, each pixel comprising a silicon FET and a silicon diode, each FET comprising a gate dielectric layer and a silicon layer, wherein the full, as-deposited, thickness of the FET gate dielectric and at least part of the FET silicon layer remains beneath the diode silicon across the entirety of the detector in which the edges or perimeters of the diode silicon features are self-aligned to the underlying FET silicon features.

10. The method of claim 9, wherein forming an array of pixels, comprises forming an array of silicon FET devices and corresponding silicon photodiode devices configured to generate electrical signals in response to optical photons.

11. The method of claim 10, wherein forming an array of pixels comprises forming an array of silicon FET thin film transistors, each configured as a switch responsive to the electrical signals generated by a corresponding photodiode.

12. The method of claim 9, wherein forming an array of pixels, each pixel comprising a silicon FET and a silicon diode, comprises:

depositing a gate dielectric layer for each pixel;
depositing a silicon layer on top of the gate dielectric layer for each pixel;
depositing a molybdenum layer on top of a first portion of the silicon layer for each pixel;
depositing a silicon oxide layer on top of the molybdenum layer and on top of a second portion of the silicon layer for each pixel; and
depositing a diode silicon layer on top of the silicon oxide layer and on top of a third portion of the silicon layer for each pixel.

13. A method of manufacturing a pixel element for use in an imaging system, the method comprising:

forming a silicon FET and a silicon diode, each FET comprising a gate dielectric layer and a silicon layer, wherein the full, as-deposited, thickness of the FET gate dielectric and at least part of the FET silicon layer remains beneath the diode silicon across the entirety of the pixel element in which the edges or perimeters of the diode silicon features are self-aligned to the underlying FET silicon features.

14. The method of claim 13, wherein forming a silicon FET and a silicon diode, comprises forming a silicon FET and corresponding silicon photodiode configured to generate electrical signals in response to optical photons.

15. The method of claim 14, wherein forming a silicon FET comprises forming a silicon FET thin film transistor configured as a switch responsive to the electrical signals generated by a corresponding photodiode.

16. The method of claim 13, wherein forming a silicon FET and a silicon diode, comprises:

depositing a gate dielectric layer;
depositing a silicon layer on top of the gate dielectric layer;
depositing a molybdenum layer on top of a first portion of the silicon layer;
depositing a silicon oxide layer on top of the molybdenum layer and on top of a second portion of the silicon layer; and
depositing a diode silicon layer on top of the silicon oxide layer and on top of a third portion of the silicon layer.

17. A method of manufacturing a pixel element for use in an imaging detector, the method comprising:

depositing a gate dielectric layer;
depositing a silicon layer on top of the gate dielectric layer;
depositing a molybdenum layer on top of the silicon layer;
depositing a silicon oxide layer on top of the molybdenum layer;
depositing a diode silicon layer on top of the silicon oxide layer, wherein all layers are deposited uniformly over the imaging detector panel; and
selectively patterning and etching each layer subsequent to its deposition to determine where the deposited layer material remains, such that the full, as-deposited, thickness of the gate dielectric layer and at least part of the silicon layer remains beneath the diode silicon across the entirety of the pixel element in which the edges or perimeters of the diode silicon features are self-aligned to the underlying silicon features.

18. A method of manufacturing a pixel element for use in an imaging detector, the method comprising:

depositing a gate dielectric layer;
depositing a silicon layer on top of the gate dielectric layer;
depositing a molybdenum layer on top of the silicon layer;
depositing a silicon oxide layer on top of the molybdenum layer;
depositing a diode silicon layer on top of the silicon oxide layer, wherein all layers are deposited uniformly over the imaging detector panel; and
simultaneously etching the diode silicon layer and the silicon layer such that the full, as-deposited, thickness of the gate dielectric layer and at least part of the silicon layer remains beneath the diode silicon across the entirety of the pixel element in which the edges or perimeters of the diode silicon features are self-aligned to the underlying silicon features.

19. A method of manufacturing a detector panel for use in an imaging system, the method comprising:

depositing a gate dielectric layer;
depositing a silicon layer on top of the gate dielectric layer;
depositing a molybdenum layer on top of the silicon layer;
depositing a silicon oxide layer on top of the molybdenum layer;
depositing a diode silicon layer on top of the silicon oxide layer, wherein all layers are deposited uniformly over the detector panel; and
simultaneously etching the diode silicon layer and the silicon layer to form isolated pixel structures such that the full, as-deposited, thickness of the gate dielectric layer and at least part of the silicon layer remains beneath the diode silicon across the entirety of the detector panel in which the edges or perimeters of the diode silicon features are self-aligned to the underlying silicon features.

20. The method of claim 19, wherein simultaneously etching the diode silicon layer and the silicon layer to form isolated pixel structures comprises simultaneously etching the diode silicon layer and the silicon layer to form isolated array photodiodes and corresponding input/output elements.

* * * * *

UNITED STATES PATENT AND TRADEMARK OFFICE
CERTIFICATE OF CORRECTION

PATENT NO. : 7,897,929 B2  Page 1 of 1
APPLICATION NO. : 11/999909
DATED : March 1, 2011
INVENTOR(S) : Albagli et al.

It is certified that error appears in the above-identified patent and that said Letters Patent is hereby corrected as shown below:

On the Title Page, Item (74), under "Attorney, Agent, or Firm", Line 1, delete "John" and insert -- Jason --, therefor.

Signed and Sealed this
Nineteenth Day of April, 2011

David J. Kappos
*Director of the United States Patent and Trademark Office*